United States Patent [19]

Furihata

[11] Patent Number: 4,504,792
[45] Date of Patent: Mar. 12, 1985

[54] FM DETECTOR USING MONOSTABLE MULTIVIBRATORS

[75] Inventor: Makoto Furihata, Gunma, Japan

[73] Assignee: Hitachi, Ltd., Tokyo, Japan

[21] Appl. No.: 462,961

[22] Filed: Feb. 1, 1983

[30] Foreign Application Priority Data

Feb. 10, 1982 [JP] Japan .................................. 57-18744

[51] Int. Cl.³ .......................... H03D 3/00; H03K 9/06
[52] U.S. Cl. .................................... 329/106; 329/107;
329/128; 375/80; 375/94; 455/214
[58] Field of Search .............. 329/106, 107, 110, 126,
329/128; 375/80, 94, 95; 455/214, 337

[56] References Cited

U.S. PATENT DOCUMENTS

| 3,233,181 | 1/1966 | Calfee ................... | 329/128 |
| 3,244,991 | 4/1966 | Hofmann .............. | 329/128 |
| 3,571,736 | 3/1971 | West ..................... | 329/106 X |
| 3,778,638 | 12/1973 | Garratt .................. | 307/233 |
| 3,843,928 | 10/1974 | Nishimura et al. .... | 329/128 |

FOREIGN PATENT DOCUMENTS

| 1812453 | 8/1969 | Fed. Rep. of Germany . |
| 2005672 | 8/1971 | Fed. Rep. of Germany . |
| 2338766 | 2/1974 | Fed. Rep. of Germany . |
| 2343542 | 3/1974 | Fed. Rep. of Germany . |
| 2195115 | 3/1974 | Fed. Rep. of Germany . |
| 2245556 | 3/1975 | Fed. Rep. of Germany . |
| 3024621 | 5/1981 | Fed. Rep. of Germany . |
| 1063641 | 3/1967 | United Kingdom . |
| 1097845 | 1/1968 | United Kingdom . |
| 1322890 | 7/1973 | United Kingdom . |
| 1437325 | 5/1976 | United Kingdom . |
| 1436212 | 5/1976 | United Kingdom . |
| 1576840 | 10/1980 | United Kingdom . |

OTHER PUBLICATIONS

NTZ 30, 1977, pp. 571 to 577.
Radio-Mentor 1969, 1, pp. 36 to 40.
Elektronik, 15, 1966, 11, p. 336.
IBM Technical Disclosure Bulletin 11, 1969, 10, p. 1251.

Primary Examiner—Siegfried H. Grimm
Attorney, Agent, or Firm—Antonelli, Terry & Wands

[57] ABSTRACT

A frequency modulation detector is constructed of a plurality of monostable multivibrators, an analog and a low-pass filter. One of the plurality of monostable multivibrators generates a first train of pulses of predetermined pulse width in response to the rising edges of an input signal, while another of the plurality of monostable multivibrators generates a second train of pulses of the same predetermined pulse width in response to the falling edges of the input signal. The first and second trains of pulses are applied to the analog adder, an output signal of which is applied to an input terminal of the low-pass filter. An FM detection output signal is provided from an output terminal of the low-pass filter. By this means the high-frequency components and carrier components of the input to be contained in the FM detection output signal are substantially reduced.

20 Claims, 8 Drawing Figures

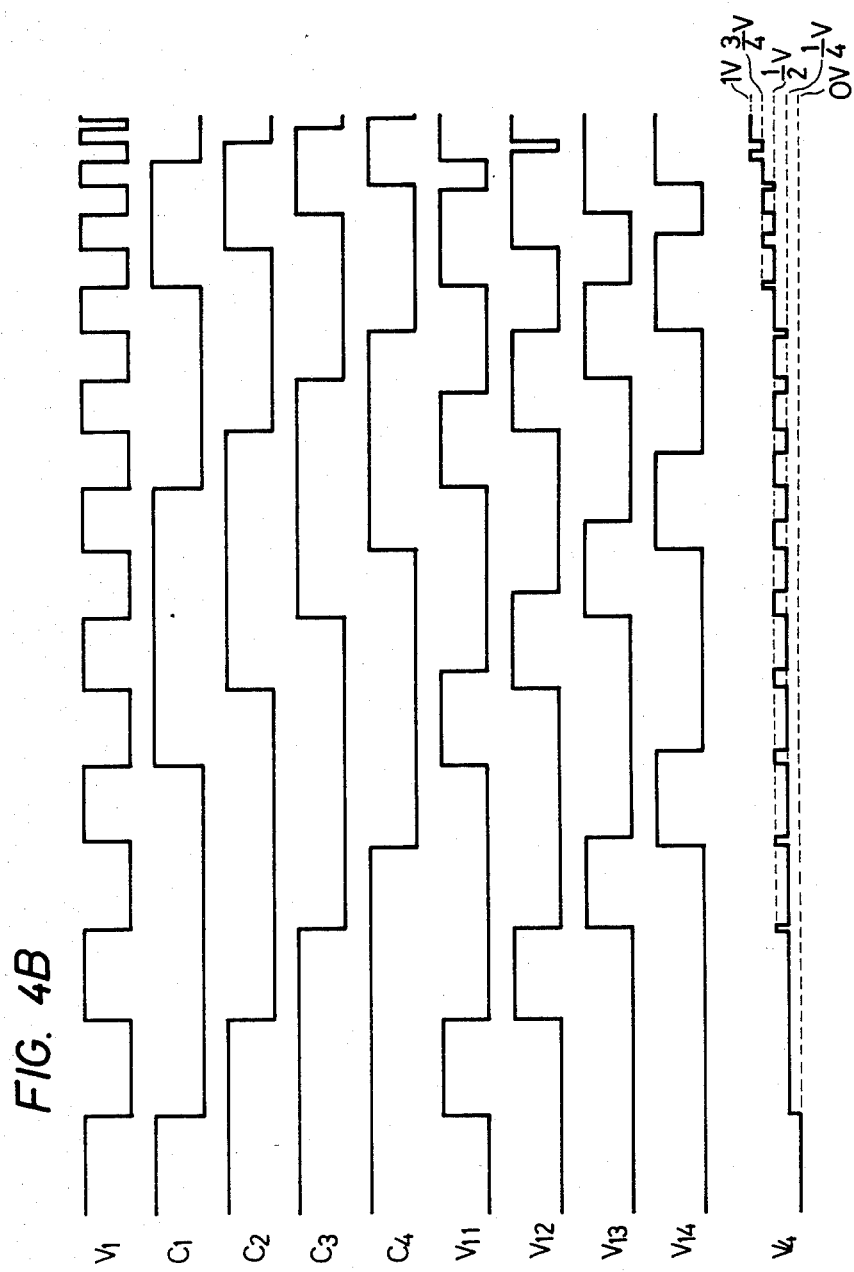

FM DETECTOR USING MONOSTABLE MULTIVIBRATORS

BACKGROUND OF THE INVENTION

This invention relates to a frequency modulation detector.

A previously-proposed pulse count FM detector produces an FM detection output in such a way that a frequency (FM) signal turned into a pulse train by an FM limiter is converted into a train of pulses having a predetermined pulse width every period (single) or every half period (double), by a monostable multivibrator (pulse width modulation), and that the train of pulses is passed through a low-pass filter.

Such a detection system has the disadvantage that, since the pulse train generated by the pulse width modulation is a binary pulse signal, high-frequency components and carrier components contained therein are liable to appear at the output of the low-pass filter, resulting in an inferior S/N (signal-to-noise) ratio of the FM detection output.

SUMMARY OF THE INVENTION

An object of this invention is to provide a pulse count FM detector which can achieve an improved S/N ratio.

Another object of this invention is to provide a pulse count FM detector which achieves enhancement in responsiveness.

Further objects of this invention will become apparent from the following description taken in conjunction with the drawings.

DESCRIPTION OF THE DRAWINGS

FIGS. 4A and 4B are a block diagram and an operating timing diagram, respectively, showing a modification of the embodiment of FIGS. 3A and 3B.

DESCRIPTION OF THE PREFERRED EMBODIMENTS

This invention will now be described in detail in connection with various preferred embodiments.

Figure 1A:
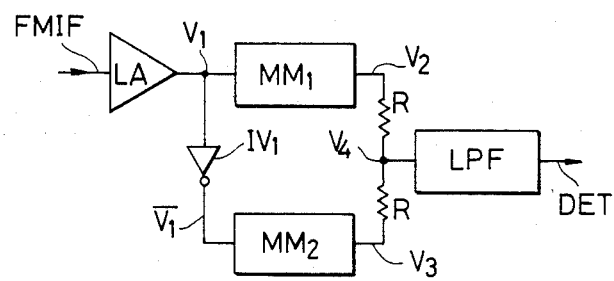
FIGS. 1A and 1B are a block diagram and an operating timing diagram, respectively, showing an embodiment in the case where this invention is applied to a double count type FM detector.

FIG. 1A is a block diagram of an embodiment in the case where this invention is applied to a double count type FM detector.

The element LA is a limiter-amplifier which converts the waveform of an FM intermediate frequency amplifier output signal FMIF into a train of pulses $V_1$ having a predetermined amplitude.

The element $MM_1$ is a monostable multivibrator which receives the pulse train $V_1$. Though not especially restricted thereto, the monostable multivibrator $MM_1$ forms a train of output pulses $V_2$ of a predetermined pulse width which are synchronous with the rising or leading edges of the train of pulses $V_1$. The element $MM_2$ is a monostable multivibrator which receives a train of pulses $\overline{V_1}$ with the pulse train $V_1$ inverted by an inverter $IV_1$. It forms a train of output pulses $V_3$ which have a predetermined pulse width similar to the output pulse train $V_2$ and which are synchronous with the rising edges of the train of pulses $\overline{V_1}$ (the falling or trailing edges of the train of pulses $V_1$) likewise to the above. In this embodiment, the pulse width of each pulse in the pulse trains forming the outputs $V_2$ and $V_3$ formed by the monostable multivibrators $MM_1$ and $MM_2$ is set to be substantially equal to the pulse width of the train of pulses $V_1$ at the time at which the frequency of the train of pulses $V_1$ is at the center frequency of the FM intermediate frequency signal (the frequency during no modulation), unlike the pulse width in the prior art pulse count detector.

The outputs $V_2$ and $V_3$ of the respective monostable multivibrators $MM_1$ and $MM_2$ are analog-added by two resistors R. The added pulse signal is transmitted to a low-pass filter LPF, the output of which provides an FM detection output DET. Since the output pulses $V_2$ and $V_3$ from the respective monostable multivibrators $MM_1$ and $MM_2$ are provided every half period of the train of input pulses $V_1$, a pulse count FM detection operation of the double type is performed.

Figure 1B:
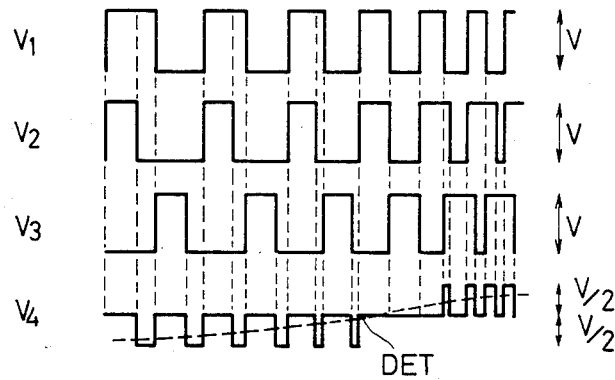

The operations of the circuit of this embodiment will be described with reference to a timing diagram of FIG. 1B. There will be explained a case where, as illustrated in the figure, the train of pulses $V_1$ is modulated from a low frequency through the center frequency (the frequency during no modulation) to a high frequency. The output $V_2$ of the monostable multivibrator $MM_1$ becomes a train of pulses having a predetermined pulse width, which pulses are synchronous with the rising or leading edges of the train of pulses $V_1$. On the other hand, the output $V_3$ of the monostable multivibrator $MM_2$ becomes a train of pulses of the same predetermined pulse width, which pulses are synchronous with the falling or trailing edges of the train of pulses $V_1$.

As in the previously proposed pulse count FM detector, the trains of pulses $V_2$ and $V_3$ have pulse widths which are equal to each other. The invention, however, greatly differs in technical concept from the previously-proposed detector in that the pulse widths are enlarged as described above and the analog addition of both trains of pulses is effected.

More specifically, the trains of output pulses $V_2$ and $V_3$ from the respective monostable multivibrators $MM_1$ and $MM_2$ are synthesized (analog-added) through the resistors R. As illustrated in the figure, accordingly, the analog addition voltage $V_4$ will be at a low level (0 volt) when both the trains of pulses $V_2$ and $V_3$ are at the low level, and it is divided by the resistors R and becomes a medium level (V/2) when only one of the trains of pulses $V_2$ and $V_3$ is at the high level. Further, when both the trains of pulses $V_2$ and $V_3$ are at the high level, the analog addition voltage $V_4$ will be at the high level (V).

In other words, when the frequency of the train of input pulses $V_1$ is lower than the center frequency of the FM intermediate frequency signal, the trains of pulses $V_2$ and $V_3$ will not be at the high level simultaneously, so that the analog addition voltage $V_4$ forms a train of pulses which change between the medium level (V/2) and the low level. Subsequently, when the frequency of the train of input pulses $V_1$ is equal to the center frequency of the FM intermediate frequency signal, the trains of pulses $V_2$ and $V_3$ will be at the high level alternately without intermission. Therefore, the analog addition voltage $V_4$ agrees with the medium level $V/2$.

When the frequency of the train of input pulses $V_1$ becomes higher than the center frequency of the FM intermediate frequency signal, the high levels of the trains of pulses $V_2$ and $V_3$ partially overlap each other. Thus, the analog addition voltage $V_4$ will be at the high level (V) for the period during which the high levels overlap, and it will be at the medium level $V/2$ when either of the train of pulses $V_2$ or $V_3$ is at the high level. Accordingly, the analog addition voltage $V_4$ becomes a train of pulses which change between the medium level ($V/2$) and the high level (V).

In summary, the analog addition voltage $V_4$ becomes a modulation signal whose pulse width and pulse level both changes in accordance with the frequency of the train of input pulses $V_1$. As shown in FIG. 1B, accordingly, the level of the input signal $V_4$ to the low-pass filter coincides with the medium level $V/2$ without changing, during no modulation (that is, when the frequency of the train of input pulses $V_1$ is equal to the center frequency of the FM intermediate frequency signal). Consequently, carrier (intermediate frequency) components do not appear at the output of the low-pass filter LPF. For the above reason, a detection output signal DET of very low distortion can be produced.

Further, the analog addition voltage $V_4$ changes between the low level (0 volt), the medium level ($V/2$) and the high level (V), and such voltage values are obtained every half period (double) of the train of input pulses $V_1$. Therefore, an FM detection output DET of quick response can be produced.

Figure 2A:
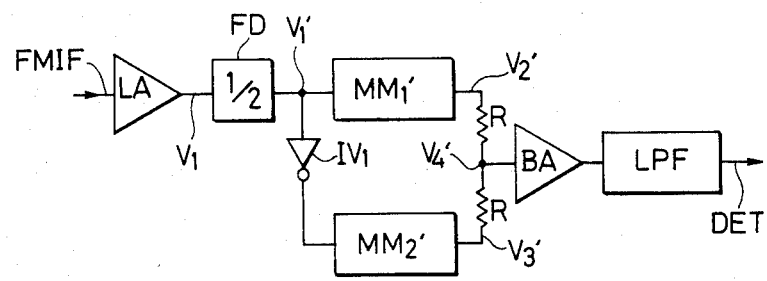
FIGS. 2A and 2B are a block diagram and an operating timing diagram, respectively, showing an embodiment in the case where this invention is applied to a single count type FM detector.
Figure 2B:
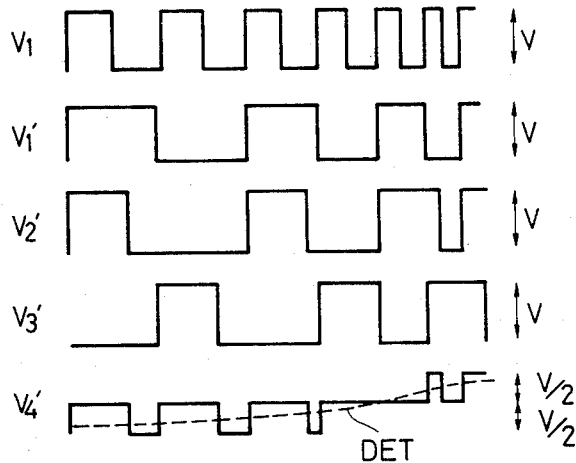

In FIGS. 2A and 2B a block diagram and an operating timing diagram of a further embodiment are shown in which this invention is applied to a single count type FM detector.

In this embodiment a train of pulses $V_1$ formed through a limiter-amplifier LA has its frequency lowered by one-half by means of a frequency divider FD. Accordingly, the period of the train of frequency division output pulses $V_1'$ at the output of the frequency divider FD is double that of the train of input pulses $V_1$. An analog addition voltage $V_4'$ with a pulse width and a pulse level modulated is produced by monostable multivibrators $MM_1'$ and $MM_2'$, analog addition resistors R, etc., having an arrangement similar to that of FIG. 1A, and this voltage $V_2'$ is transmitted to a low-pass filter LPF. In this embodiment, the analog addition voltage $V_4'$ is applied to the low-pass filter LPF through a buffer amplifier BA.

In addition, the pulse widths of the trains of output pulses $V_2'$ and $V_3'$ from the respective monostable multivibrators $MM_1'$ and $MM_2'$ are set to be substantially equal to double the pulse width of the train of pulses $V_1'$ at the time at which the frequency of the train of pulses $V_1$ is the center frequency. By setting the pulse widths in this manner, the analog addition voltage $V_4'$ can be set at the medium level ($V/2$) of its assumable values (0 V–1 V) when the frequency of the train of pulses $V_1$ is equal to the center frequency of the FM intermediate frequency signal.

Since this embodiment is of the single count type, the responsiveness is somewhat inferior. On the other hand, however, there is the advantage that the monostable multivibrators $MM_1'$ and $MM_2'$ may be of the type having a low response speed, in other words, circuits of low cost.

Figure 3A:
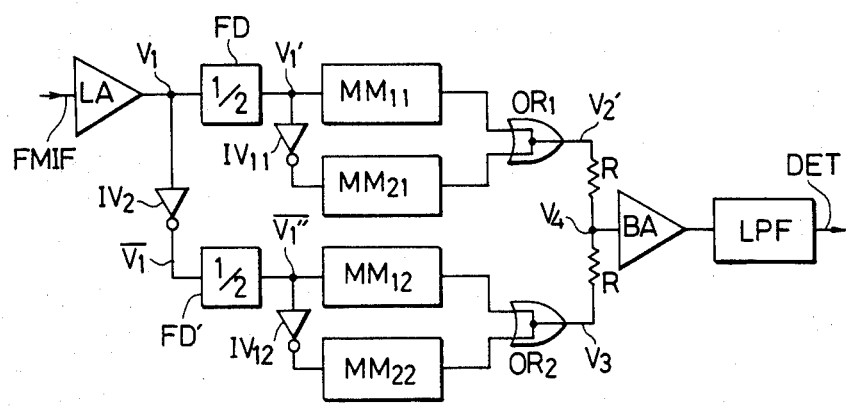
FIGS. 3A and 3B are a block diagram and an operating timing diagram, respectively, showing another embodiment in the case where this invention is applied to the double pulse count FM detector.
Figure 3B:
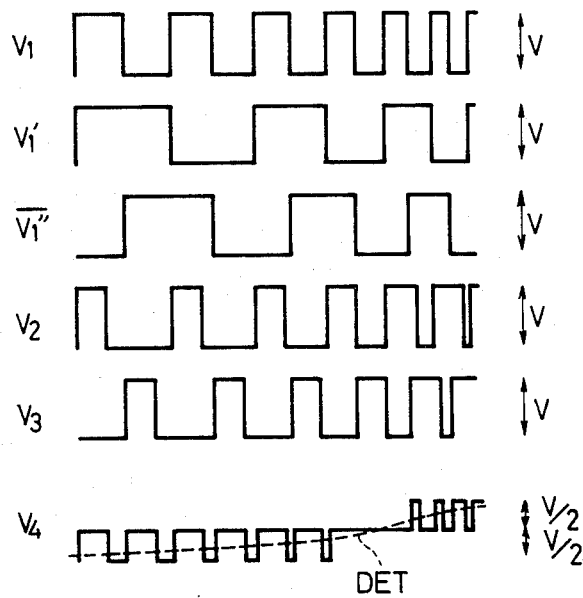

FIGS. 3A and 3B show a block diagram and an operating timing diagram of another embodiment in the case where this invention is applied to the double count type FM detector.

A train of input pulses $V_1$ formed by a limiter-amplifier LA is, on one hand, subjected to one-half frequency division by a first frequency divider FD and then applied to a monostable multivibrator $MM_{11}$. The frequency-divided pulse train is also applied to a monostable multivibrator $MM_{21}$ through an inverter $IV_{11}$. Outputs from these monostable multivibrators $MM_{11}$ and $MM_{21}$ are converted into a logical sum signal $V_2$ by wired-OR circuit OR1 of high-level-preference.

The train of input pulses $V_1$ is, on the other hand, inverted by an inverter $IV_2$. The inverted pulse train is subjected to frequency division by a second one-half frequency divider FD, and then applied to a monostable multivibrator $MM_{12}$. The frequency-divided pulse train $\overline{V_1''}$ is applied to a monostable multivibrator $MM_{22}$ through an inverter $IV_{12}$. Outputs from these monostable multivibrators $MM_{12}$ and $MM_{22}$ are converted into a logical sum signal $V_3$ by wired-OR circuit OR2 of high level-preference.

Similar to the above embodiments, the logical sum signals $V_2$ and $V_3$ are applied to the two resistors R so as to form an analog addition voltage $V_4$. Further, the analog addition voltage $V_4$ is transmitted through a buffer amplifier BA to a low-pass filter LPF, in which it is converted into an FM detection output signal DET.

In this embodiment, the pulse widths of the output pulses of the monostable multivibrators $MM_{11}$ and $MM_{22}$ are set to be substantially equal to the pulse width of the train of pulses $V_1$ at the time at which the frequency of the pulse train $V_1$ is equal to the center frequency of the FM intermediate frequency signal (the frequency during no modulation).

In this embodiment, the outputs of one set of monostable multivibrators $MM_{11}$, $MM_{21}$ and $MM_{12}$, $MM_{22}$ are logically summed, respectively. In effect, therefore, operations similar to those of the circuit in FIG. 1A are performed.

Figure 4A:
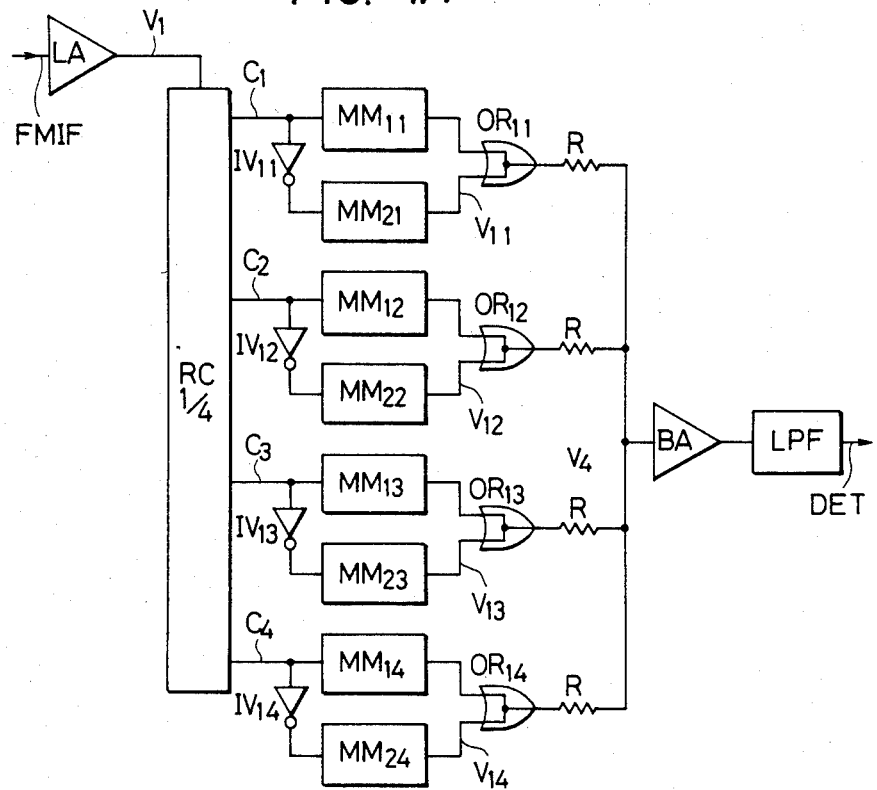

In FIG. 4A there is shown a block diagram of an embodiment of a pulse count FM detector in which the embodiment of FIG. 3A is modified to provide a still lower distortion factor. This embodiment is so constructed that an analog addition voltage $V_4$ on the input side of a low-pass filter LPF has five levels, for example, 0 V, ¼ V, (2/4) V, ¾ V and 1 V.

A train of input pulses $V_1$ formed by a limiter-amplifier LA is converted into frequency division outputs $C_1$ to $C_4$ each differing in frequency, by a ring counter RC which acts as a delay circuit. The pulse trains $C_1$ to $C_4$ subjected to one-fourth frequency division are respectively applied to monostable multivibrators $MM_{11}$ to $MM_{14}$ on the one hand. In addition, the pulse trains $C_1$ to $C_4$ are respectively inverted by inverters $IV_{11}$ to $IV_{14}$ and applied to monostable multivibrators $MM_{21}$ to $MM_{24}$ on the other hand.

Outputs from the monostable multivibrators $MM_{11}$ and $MM_{21}$ are converted into a logical sum signal $V_{11}$ by wired-OR circuit $OR_{11}$ of high-level-preference. The same applies to the other sets of monostable multivibrators $MM_{12}$ and $MM_{22}$, etc. Such logical sum signals $V_{11}$ to $V_{14}$ are respectively applied to resistors R so as to form the analog addition voltage $V_4$. This analog addition voltage $V_4$ is applied through a buffer amplifier BA to the low-pass filter LPF, in which an FM detection output signal DET is produced.

The pulse widths of the output pulses of the monostable multivibrators $MM_{11}$ to $MM_{24}$ are set to be substantially equal to double the pulse width of the train of pulses $V_1$ at the time at which the frequency of the pulse train $V_1$ is equal to the center frequency. By setting the pulse widths in this manner, the analog addition voltage $V_4$ can be set at the medium level ($\frac{1}{2}$ V) of its assumable values (0 V–1 V) when the frequency of the train of pulses $V_1$ is equal to the center frequency of an FM intermediate frequency signal.

The operations of the circuit of this embodiment will be described with reference to a timing diagram in FIG. 4B. There will be explained a case where, as illustrated in the figure, the train of pulses $V_1$ are modulated from a low frequency via the center frequency to a high frequency.

Although not especially restricted thereto, the frequency division output $C_1$ of the ring counter RC has its level changed in synchronism with the fall of every second period of the train of input pulses $V_1$. Therefore, one period of this output becomes quadruple the period of the train of input pulses $V_1$. The other frequency division outputs $C_2$ to $C_4$ of the ring counter RC change with successive delays each of which is equal to a half period of the train of input pulses $V_1$.

The logical sum output $V_{11}$ formed from the outputs of the monostable multivibrators $MM_{11}$ and $MM_{21}$ which receive the frequency division output $C_1$ and the inverted signal thereof, becomes a train of pulses which have a predetermined pulse width and which are synchronous with the falling or trailing edges every half period of the frequency division output $C_1$, namely, every two periods of the input pulse train $V_1$. The logical sum outputs $V_{12}$ to $V_{14}$ for the other frequency division outputs $C_2$ and $C_4$ become trains of pulses which have successive delays, each being equal to the half period of the input pulse train $V_1$, with respect to the pulse train $V_{11}$.

When the frequency of the pulse train $V_1$ is equal to the center frequency of the FM intermediate frequency signal (the frequency during no modulation), two of the pulse trains $V_{11}$ to $V_{14}$ will be at the high level at the same time in succession. The analog addition voltage $V_4$ therefore will be at the medium level ($\frac{1}{2}$ V) of its assumable values (0 V–1 V).

When the frequency of the input pulse train $V_1$ becomes lower than the center frequency mentioned above, one of the pulse trains $V_{11}$ to $V_{14}$ will be at the high level or two of them will be at the high level simultaneously, in the first place. The analog addition voltage $V_4$ therefore becomes a pulse signal which changes between the aforementioned medium level (V/2) and a $\frac{1}{4}$ level (V/4).

When the frequency of the input pulse train $V_1$ becomes still lower, any two or more of the pulse trains $V_{11}$ to $V_{14}$ will not be at the high level simultaneously. As a result, the analog addition voltage $V_4$ becomes a pulse signal which changes between the aforementioned $\frac{1}{4}$ level ($\frac{1}{4}$ V) and the low level (0 V).

On the other hand, when the frequency of the pulse train $V_1$ becomes higher than the center frequency, any two or three of the pulse trains $V_{11}$ to $V_{14}$ will be at the high level at the same time in succession, in the first place. The analog addition voltage $V_4$ therefore becomes a pulse train signal which changes between the medium level (V/2) and a $\frac{3}{4}$ level ($\frac{3}{4}$ V).

When the frequency of the pulse train $V_1$ becomes still higher, any three of four of the pulse trains $V_{11}$ to $V_{14}$ will be at the high level at the same time in succession. The analog addition voltage $V_4$ therefore becomes a pulse signal which changes between the $\frac{3}{4}$ level ($\frac{3}{4}$ V) and the high level (1 V).

In this manner, the analog addition voltage $V_4$ becomes a signal wherein the level which the pulse can assume changes in accordance with the frequency of the pulse train $V_1$.

This invention is not restricted to the foregoing embodiments. The inverters $IV_1$ and $IV_{11}$ to $IV_{14}$ may be dispensed with by constructing one of each set of monostable multivibrators as the positive edge trigger type and the other monostable multivibrators as the negative edge trigger type. In addition, as the logical sum circuits in FIGS. 3A and 4A, logic gate (OR) circuits may be utilized.

Further, the analog adder circuit may be made of an operational amplifier circuit so as to amplify the maximum level into, e.g., 2 V or 4 V. Also, in this way, the gain of a succeeding-stage amplifier which receives the detection output can be made low, and the S/N (signal-to-noise) ratio does not degrade and can be improved still more because the gain on the input side can be made high.

The embodiment of FIG. 4A may be modified so as to change the addition output every $\frac{1}{8}$ V, by increasing the frequency division ratio even more than provided in this embodiment.

This invention can be extensively utilized in the FM detectors of FM radio receivers and also video tape recorders, video disk players etc.

While I have shown and described several embodiments in accordance with the present invention, it is to be understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A frequency modulation detector comprising:
    means including a plurality of monostable multivibrators each responsive to a frequency modulated input signal for generating respective output signals of predetermined pulse width Wp in response to rising or falling edges of said input signal;
    analog adder means for analog adding the respective output signals of said plurality of monostable multivibrators; and
    a low-pass filter having an input terminal which is connected to receive the output signal from said analog adder means and having an output terminal which provides a detection output signal, wherein said predetermined pulse width Wp and a pulse width Wp' of said input signal at the time at which the frequency of said input signal is at the center frequency of the frequency modulated intermediate frequency input signal have the relationship Wp=N·Wp' wherein N is an integer.

2. A frequency modulation detector according to claim 1, wherein one of said plurality of monostable multivibrators generates an output signal in the form of a first train of pulses having said predetermined pulse width in response to the rising edges of said input signal, and another of said plurality of monostable multivibrators generates an output signal in the form of a second train of pulses of the same predetermined pulse width in response to the falling edges of said input signal.

3. A frequency modulation detector according to claim 2, wherein an inverter is connected between an input terminal of said one of said plurality of monostable multivibrators and an input terminal of said other monostable multivibrator, and further including means for applying said input signal to the input terminal of said one monostable multivibrator.

4. A frequency modulation detector according to claim 1, further comprising:
a limiter-amplifier which supplies the input signal to input terminals of said plurality of monostable multivibrators.

5. A frequency modulation detector according to claim 4, further comprising:
a frequency divider which is disposed between an output terminal of said limiter-amplifier and the input terminals of said plurality of monostable multivibrators.

6. A frequency modulation detector according to claim 5, wherein said frequency divider executes a one-half frequency division.

7. A frequency modulation detector according to claim 1, wherein said frequency modulated input signal is a pulse width modulated signal whose pulse width varies on either side of a center modulation frequency, and wherein said predetermined pulse width of said output signals of said monostable multivibrators is equal to the pulse width of said frequency modulated input signal at said center modulation frequency.

8. A frequency modulation detector comprising:
first means including at least one monostable multivibrator responsive to a frequency modulated input pulse signal for generating a first train of pulses of predetermined pulse width Wp in response to the rising edges of said input pulse signal;
second means including at least one monostable multivibrator responsive to said frequency modulated input pulse signal for generating a second train of pulses of said same predetermined width Wp in response to the falling edges of said input pulse signal;
analog adder means connected to said first and second means for analog-adding said first and second trains of pulses; and
output means including a low pass filter connected to the output of said analog adder means for producing a detection output signal, wherein said predetermined pulse width Wp and a pulse width Wp' of said input pulse signal at the time at which the frequency of said input pulse signal is at the center frequency of the frequency modulated intermediate frequency input pulse signal has the relationship Wp=N·Wp' wherein N is an integer.

9. A frequency modulation detector according to claim 8, further including input means for applying to said first and second means as said input pulse signal a pulse width modulated signal whose pulse width varies on either side of a center modulation frequency.

10. A frequency modulation detector according to claim 9, wherein said predetermined pulse width of said first and second trains of pulses is equal to the pulse width of said pulse width modulated signal at said center modulation frequency.

11. A frequency modulation detector according to claim 9, wherein said input means includes a limiter amplifier, the output of which is applied to said first and second means.

12. A frequency modulation detector according to claim 11, wherein said input means further includes a frequency divider means connected between the output of said limiter amplifier and the inputs of said first and second means for dividing the frequency of said pulse width modulated signal.

13. A frequency modulation detector according to claim 12, wherein said output means includes a buffer amplifier connected between the output of said analog adder means and said low pass filter.

14. A frequency modulation detector according to claim 8, wherein said first means further includes another monostable multivibrator responsive to said frequency modulated input pulse signal for generating a third train of pulses of said predetermined pulse width in response to the falling edges of said input pulse signal and a first logic OR circuit connecting the outputs of said one and another monostable multivibrators of said first means to one input of said analog adder means.

15. A frequency modulation detector according to claim 14, wherein said second means further includes another monostable multivibrator responsive to said frequency modulated input pulse signal for generating a fourth train of pulses of said predetermined pulse width in response to the rising edges of said input pulse signal and a second logic OR circuit connecting the outputs of said one and another monostable multivibrators of said second means to another input of said analog adder means.

16. A frequency modulation detector according to claim 15, wherein said input means includes a limiter amplifier, the output of which is applied to said first and second means.

17. A frequency modulation detector according to claim 16, wherein said input means further includes a frequency divider means connected between the output of said limiter amplifier and the inputs of said first and second means for dividing the frequency of said pulse width modulated signal.

18. A frequency modulation detector according to claim 15, wherein said input means includes ring counter means for delaying the pulses of said frequency modulated input pulse signal so as to produce respective input signals which are delayed with respect to each other by a predetermined amount and are applied respectively to said first and second means.

19. A frequency modulation detector according to claim 18, further including third and fourth means having the same construction as said first and second means, said analog adder means receiving the outputs of said first through fourth means which receive respective input signals from said ring counter means.

20. A frequency modulation detector according to claim 19, wherein the respective input signals to said first through fourth means from said ring counter means are delayed with respect to one another by one-fourth of the period of said frequency modulated input pulse signal.

* * * * *